(12) United States Patent
Tsai et al.

(10) Patent No.: US 7,447,068 B2
(45) Date of Patent: Nov. 4, 2008

(54) METHOD FOR PROGRAMMING A MULTILEVEL MEMORY

(75) Inventors: Fu-Kai Tsai, Taipei (TW); Yung-Feng Lin, Taoyuan (TW)

(73) Assignee: Macronix International Co., Ltd., Hsinchu (TW)

(*) Notice: Subject to any disclaimer, the term of this patent is extended or adjusted under 35 U.S.C. 154(b) by 18 days.

(21) Appl. No.: 11/723,352

(22) Filed: Mar. 19, 2007

(65) Prior Publication Data
US 2008/0232164 A1    Sep. 25, 2008

(51) Int. Cl.
*G11C 16/04* (2006.01)
(52) U.S. Cl. .................. 365/185.03; 365/185.22; 365/185.24
(58) Field of Classification Search ............ 365/185.03, 365/185.21, 185.22, 185.24
See application file for complete search history.

(56) References Cited

U.S. PATENT DOCUMENTS 7,042,766 B1* 5/2006 Wang et al. ............ 365/185.22
7,130,210 B2* 10/2006 Bathul et al. ............... 365/100
7,136,304 B2* 11/2006 Cohen et al. ............ 365/185.19

* cited by examiner

Primary Examiner—Gene N. Auduong
(74) Attorney, Agent, or Firm—Birch, Stewart, Kolasch & Birch, LLP

(57) ABSTRACT

A method for programming a MLC memory is provided. The MLC memory has a number of bits, and each bit has a number of programmed states. Each programmed state has a first PV level. The method comprises programming the bits of the memory having a Vt level lower than the first PV level of the targeted programmed state such that at least one bit of them has a Vt level larger than a second PV level corresponding to a targeted programmed state, wherein the second PV level of the targeted programmed state is larger than the corresponding first PV level; and programming only the bits of the memory with a Vt level lower than the first PV level of the targeted programmed state such that each of them has a Vt level larger than the first PV level of the targeted programmed state.

15 Claims, 4 Drawing Sheets

METHOD FOR PROGRAMMING A MULTILEVEL MEMORY

BACKGROUND OF THE INVENTION

1. Field of the Invention

The invention relates in general to a method for programming a multi-level cell (MLC) memory, and more particularly to a method for programming a MLC memory which can have a better tightened program distribution in a read operation.

2. Description of the Related Art

FIGS. 1A-1D are respectively schematic diagrams of threshold voltage (Vt) distributions of the programmed bits for a targeted programmed state in a conventional programming process of a MLC memory. As shown in FIG. 1A, the memory has an erase-state Vt distribution at first and each bit of the memory is to be programmed to a targeted programmed state. The Vt distribution of the targeted programmed state has a program verify (PV) level (a lower boundary). In order to have tightened Vt distribution of the programmed bits, a pre-PV level for the targeted programmed state is set to be lower than the PV level and two steps of program operations are performed as below.

In the first rough program operation, after a number of program shots, the bits of the memory are program to have a Vt distribution A as shown in FIG. 1B, some of which have a Vt level not lower than the pre-PV level of the targeted programmed state as shown by a dotted-line region in FIG. 1B. At the time, the memory records the bits passing (with a Vt level not lower than) the pre-PV level. Then, the bits with a Vt level lower than the pre-PV level in the Vt distribution A are further programmed to pass the pre-PV level to generate a new Vt distribution B as shown in FIG. 1C.

All the bits of the Vt distribution B pass the pre-PV level, and the memory records the bits passing the PV level first as shown by a dotted-line region in FIG. 1C. Following that, in the second fine program operation, the bits with a Vt level lower than the PV level in the Vt distribution B are further programmed to pass the PV level to generate the targeted program distribution C as shown in FIG. 1D and complete the whole programming process.

However, the above two-step program operation has at least two problems. First of all, as mentioned above, in the process of first rough programming and second fine programming, the memory has to respectively record the bits passing the pre-PV level and the bits passing the PV level, which will increase the overhead of program control flow. Secondly, as shown in FIG. 1C, after the first program operation, some faster bits with a Vt level lower than and close to the PV level (denoted by a dotted-line region F) will be programmed again in the second program operation, which results in a widened Vt distribution for the targeted programmed state and in turn increases a bit error rate.

SUMMARY OF THE INVENTION

The invention is directed to a method for programming a MLC memory. The bits of the memory are programmed such that at least one of them passes a designed higher PV level in a first program operation. Owing that the faster bits of the memory are programmed to have a Vt level between the PV level and higher PV level in the first program operation, in a second program operation when the bits not passing the PV level are programmed to pass the PV level, only slow bits of them are programmed, thereby tightening the program distribution and reducing a bit error rate.

According to the present invention, a method for programming a MLC memory. The MLC memory has a number of bits, and each bit has a number of programmed states. Each programmed state has a first PV level. The method comprises programming the bits of the memory having a threshold voltage (Vt) level lower than the first PV level of the targeted programmed state such that at least one bit of them has a Vt level not lower than a second PV level corresponding to a targeted programmed state, wherein the second PV level of the targeted programmed state is higher than the corresponding first PV level; and programming only the bits of the memory with a Vt level lower than the first PV level of the targeted programmed state such that each of them has a Vt level not lower than the first FV level of the targeted programmed state.

The invention will become apparent from the following detailed description of the preferred but non-limiting embodiments. The following description is made with reference to the accompanying drawings.

DETAILED DESCRIPTION OF THE INVENTION

The invention provides a method for programming a MLC memory. A high PV (HPV) level for a targeted program level is set to be higher than the PV level, and the HPV level and PV level are respectively a higher boundary and a lower boundary of the corresponding Vt distribution. In the first program operation, the bits of the memory not passing the PV level are first programmed such that at least one bit of them passes the HPV level. In the second program operation, the bits of the memory still not passing the PV level are programmed to pass the PV level. Therefore, the bit error rate of the memory in a read operation can be decreased due to a more tightened Vt distribution of the programmed bits.

Figure 1A:
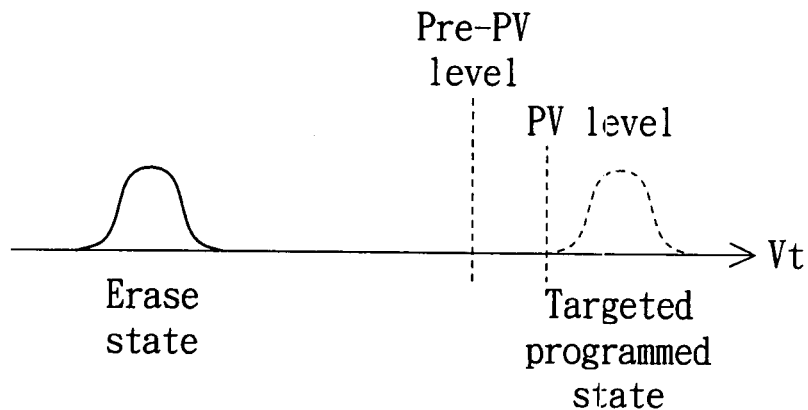
FIGS. 1A~1D are respectively schematic diagrams of Vt distributions of the programmed bits for a targeted programmed state in a conventional programming process of a MLC memory.
Figure 1B:
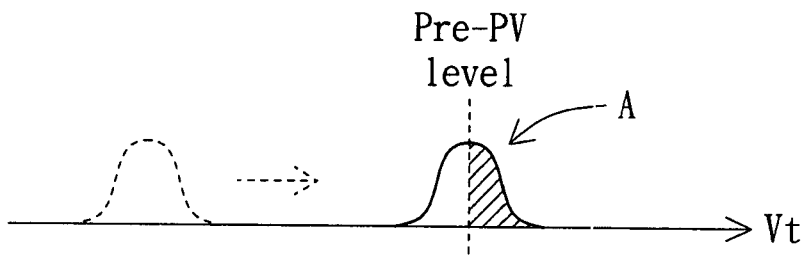
Figure 1C:
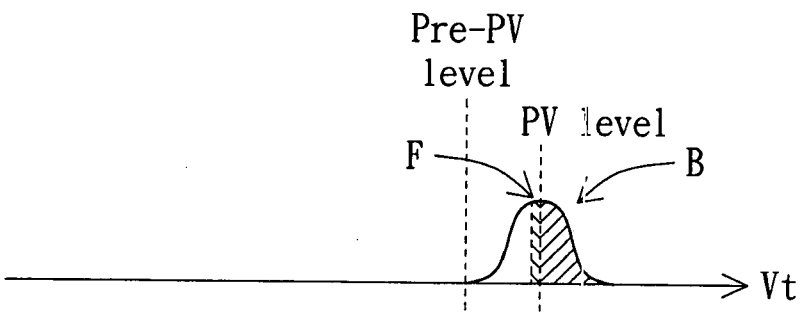
Figure 1D:
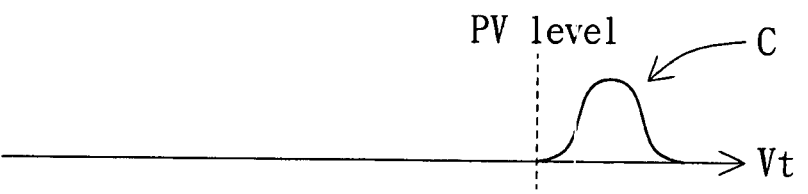
Figure 2:
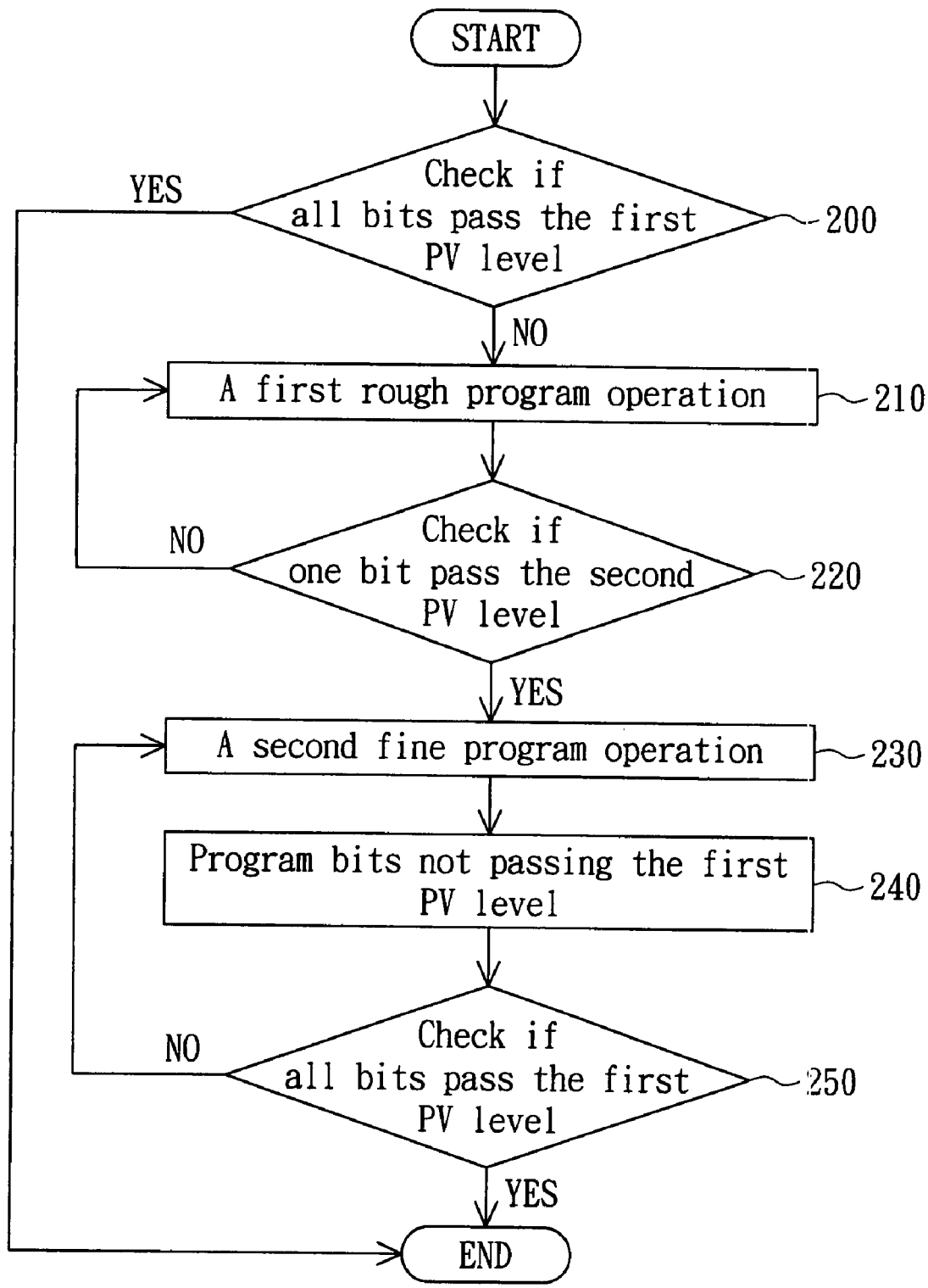
FIG. 2 is a flow chart of a method for programming a MLC memory according to a preferred embodiment of the invention.

Referring to FIG. 2, a flow chart of a method for programming a MLC memory according to a preferred embodiment of the invention is shown. For example, the MLC memory is a flash memory which is a charge trapping memory with oxide-nitride-oxide (ONO) structure.

The MLC memory includes a lot of cells, such as 1024× 256 cells, and each cell has a number of bits, such as two bits in the ONO structure. Each bit has a number of programmed states, such as 10, 00, 01 and 11. Each programmed state has a first PV level and a second PV level, wherein the second PV_ level (a higher boundary) is higher than the first PV level (a lower boundary). For example, the difference between the first PV level and the second PV level is about 300 mV~400 mV. A read margin between the adjacent programmed states 01 and 00, 00 and 01, or 01 and 11 is about 400 mV~500 mV.

Figure 3:
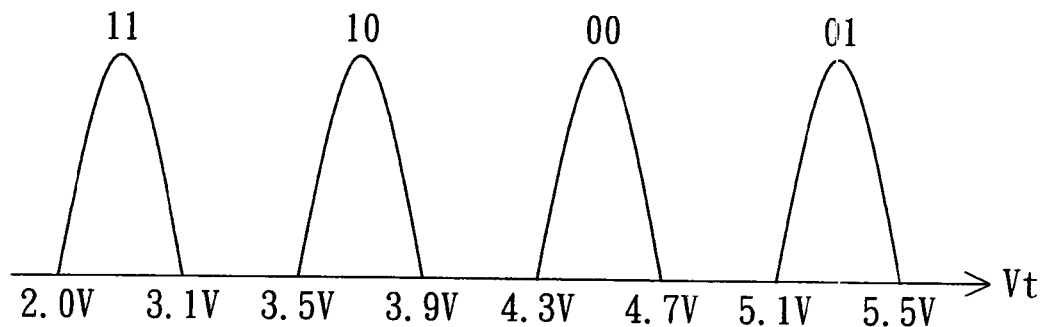
FIG. 3 is a schematic diagram of the first PV level and second PV level of the four programmed states 10, 00, 01 and 11 according to a preferred embodiment of the invention.

As shown in FIG. 3, for example, the first PV level and second PV level of the programmed state 01 are respectively 5.1V and 5.5V, the first PV level and second PV level of the programmed state 00 are respectively 4.3V and 4.7V, the first PV level and second PV level of the programmed state 10 are respectively 3.5V and 3.9V, and the first PV level and second PV level of the programmed state 11 are respectively 2.0V and 3.1V. The following steps illustrate a process for programming the bits of the memory to a targeted programmed state, such as 10. The program operation for other programmed states, such as 00, 01, can be reasoned by analog.

Figure 4A:
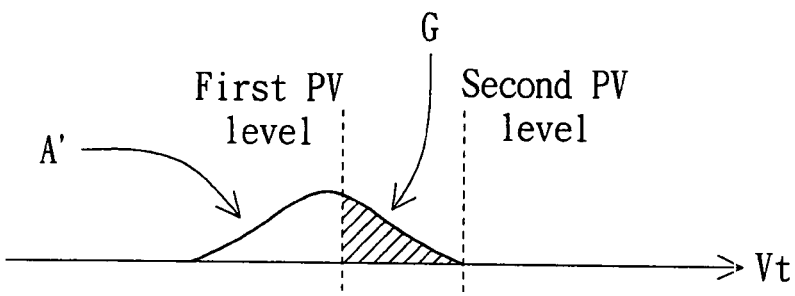
FIG. 4A is a schematic diagram of a Vt distribution of the programmed bits after the first program operation according to a preferred embodiment of the invention.

First, in step 200, check if all bits pass the first PV level, that is, determine if every bit of the memory has a Vt level not lower than the first PV level (5.1V, 4.3V or 3.5V) of the targeted programmed state (10, 00 or 10). If yes, the process is ended and if no, the step 210 is performed continuously. In the step 210, perform a first rough program operation to program the bits of the memory with a Vt level lower than the first PV level of the targeted programmed state. Then, in step 220, check if one bit passes the second PV level (5.5V, 4.7V or 3.9V) of the targeted programmed state (01, 00 or 10). If no, go back to the step 210 and if yes, it means at least one bit of them has a Vt level not lower than the corresponding second PV level and continue the step 230. As shown in FIG. 4A, after one or two program shots, in the resultant Vt distribution A' of programmed bits, some bits pass the first PV level, which are the faster bits, and some bits are still not passing the first PV level, which are the slower bits. The first rough program operation is performed by using only one or two shots so as to make sure the at least bit passing the second PV level to be close to the second PV level.

Figure 4B:
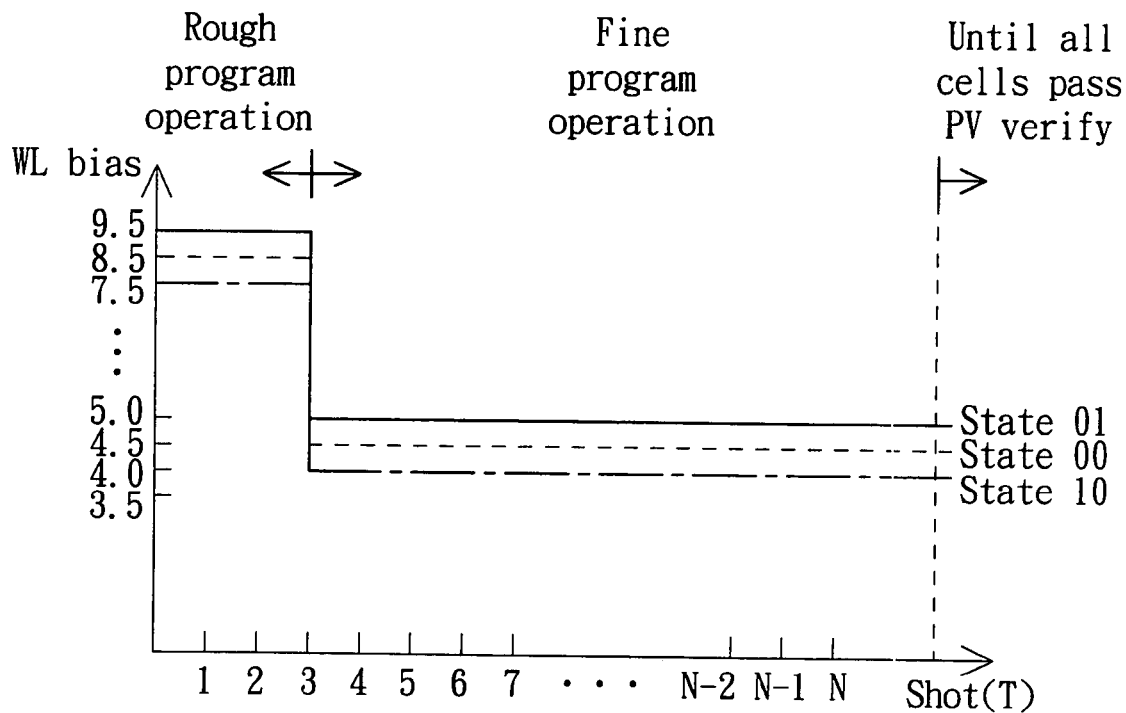
FIG. 4B is a schematic diagram of a WL bias operation according to the preferred embodiment of the invention.
Figure 4C:
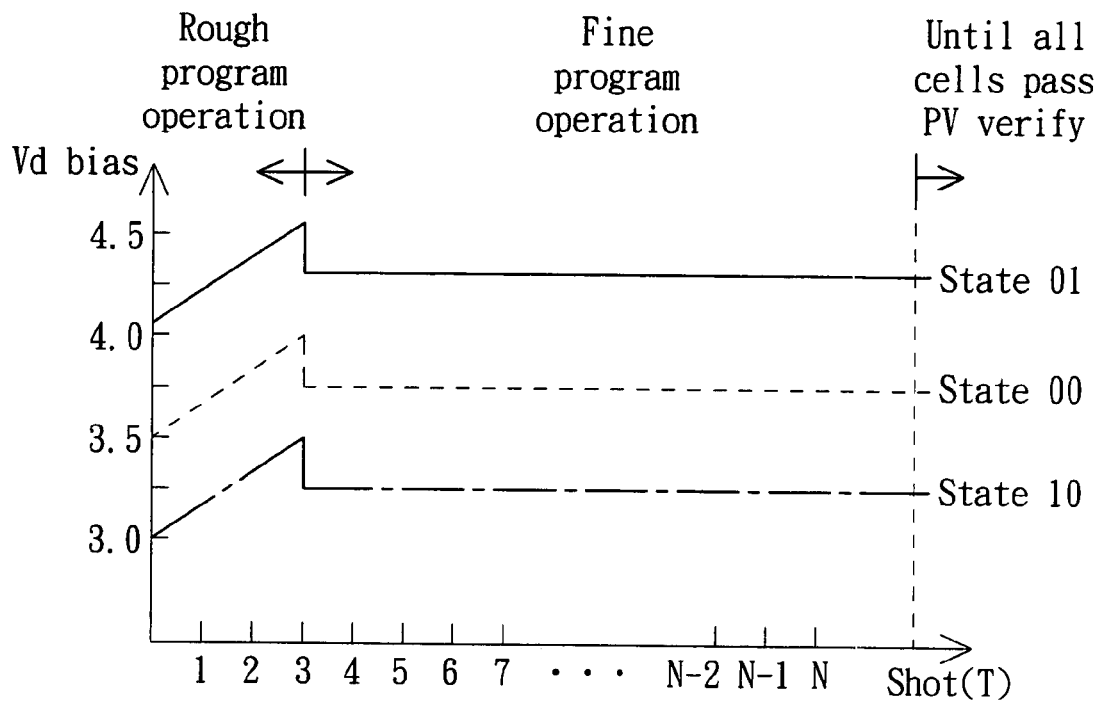
FIG. 4C is a schematic diagram of a Vd bias operation according to the preferred embodiment of the invention.

In the rough program operation, a word line of each programmed bit has a constant voltage larger than the second PV level, such as 9.5V for the state 01, 8.5V for the state 00 and 7.5V for the state 10 as shown in FIG. 4B, wherein the voltage range of WL bias is 7.5V~9.5V, and a bit line of each programmed bit has a voltage range smaller than the voltage of word line, such as increased from 4V to 4.5V for the state 01, increased from 3.5V~4.0V for the state 00 and increased from 3.0V~3.5V for the state 10 as shown in FIG. 4C.

Figure 5:
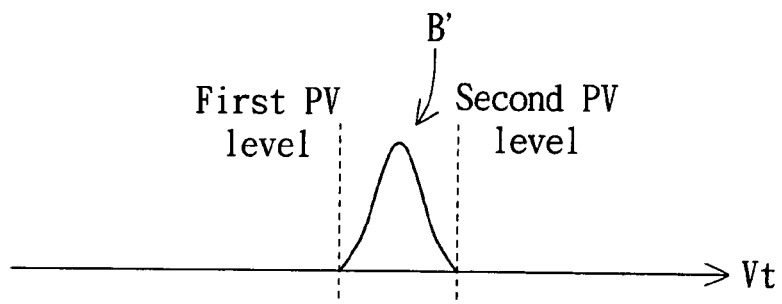
FIG. 5 is a schematic diagram of a Vt distribution of the programmed bits after the second program operation according to a preferred embodiment of the invention.

Following that, in step 230, perform a second fine program operation and then in step 240, program only the bits of the memory not passing the first PV level of the targeted programmed state in the Vt distribution A'. Then, in step 250, check if all bits pass the first PV level. If no, repeat the second fine program operation in the step 230 and if yes, it means each of them has a Vt level not lower than the first PV level of the targeted programmed state to generate the targeted program distribution B' as shown in FIG. 5, and the method is ended. In this program operation, a program verify operation is performed to check if any bit of the memory passes the first PV level and the bits passing the first PV level (denoted by a dotted-line region G in FIG. 4A) are recorded in a memory device, such as SRAM. Therefore, the bits with a Vt level lower than the first PV level can be identified and further programmed to pass the first PV level.

Most of the faster bits have a Vt level between the first PV level and the second PV level after the first program operation, i.e. are located in the region G, and in the second program operation, these faster bits are not programmed again and only the bits with a Vt level lower than the first PV level are programmed. As a result, the Vt distribution B' of programmed bits can be well constrained between the first PV level and second PV level, which has a better tightened shape than that in prior art.

In the fine program operation, a word line of each programmed bit has a constant voltage (WL bias) equal to the first PV level, such as 5.1V for the state 01, 4.3V for the state 00 and 3.5V for the state 10 as shown in FIG. 4B, and the WL bias keeps this constant voltage until all cells of the memory pass program verify. In the meanwhile a bit line of each programmed bit has a constant voltage smaller than the maximum of the Vd voltages range in the first program operation, such as 4V~4.5V, for the state 01, 3.5V~4.0V for the state 00 and 3.0V~3.5V for the state 10 as shown in FIG. 4C. The bit line has this constant Vd bias until all cells of the memory pass program verify.

As mentioned above, the first program operation can also be performed to program the bits not passing the first PV level until at least one bit of them passes a Vt level equal to the second PV level minus a small value ($\epsilon$). Thus, in the second program operation when the bits not passing the first PV level are programmed to pass the first PV level, even the Vt distribution of programmed bits shifts its maximum level a little bit forward, the Vt distribution can still have a higher boundary at the second PV level and be constrained between the first PV level and second PV level as shown in FIG. 5.

The method for programming a MLC memory disclosed by the above embodiment of the invention has the following advantages:

1. Compared to the prior-art method, although the invention also uses a two-step program operation, the bit recording operation is only performed once to record the bits with a Vt level not lower than the first PV level after the first program operation, which reduce the overhead of program control flow.

2. Owing that the faster bits of the memory are mostly located in the Vt distribution between the first PV level and second PV level after the first program operation, in the second program operation, only the slower bits not passing the first PV level are programmed to pass the first PV level. Therefore, the Vt distribution of programmed bits can be further tightened to give a larger read margin, and thus the bit error rate of the read operation can be greatly reduced.

While the invention has been described by way of example and in terms of a preferred embodiment, it is to be understood that the invention is not limited thereto. On the contrary, it is intended to rover various modifications and similar arrangements and procedures, and the scope of the appended claims therefore should be accorded the broadest interpretation so as to encompass all such modifications and similar arrangements and procedures.

What is claimed is:

1. A method for programming a multi-level cell (MLC) memory, the MLC memory comprising a plurality of bits, each bit having a plurality of programmed states, each programmed state having a first program verify (PV) level, the method comprising:

(a) programming the bits of the memory having a threshold voltage (Vt) level lower than the first PV level of a targeted programmed state such that at least one bit of them has a Vt level higher than a second PV level corresponding to the targeted programmed state, wherein the second PV level of the targeted programmed state is higher than the corresponding first PV level; and (b) programming only the bits of the memory with a Vt level lower than the first PV level of the targeted programmed state such that each of them has a Vt level higher than the first PV level of the targeted programmed state.

2. The method according to claim 1, wherein the multi-level cell memory is a charge trapping memory with oxide-nitride-oxide (ONO) structure.

3. The method according to claim 1, wherein the multi-level cell memory is a flash memory.

4. The method according to claim 1, wherein each bit has four programmed states 11, 01, 00 and 10.

5. The method according to claim 4, wherein the difference between the first PV level and the second PV level is about 300 mV~400 mV.

6. The method according to claim 5, wherein a read margin between the adjacent programmed states is about 400 mV~500 mV.

7. The method according to claim 6, wherein the first PV level and the second PV level of the programmed state 01 are respectively 5.1V and 5.5V, the first PV level and the second PV level of the programmed state 00 are respectively 4.3V and 4.7V, the first PV level and the second PV level of the programmed state 10 are respectively 3.5V and 3.9V, and the first PV level and the second PV level of the programmed state 11 are respectively 2.0V and 3.1V.

8. The method according to claim 4, wherein a word line bias of each programmed bit in step (a) is larger than that in step (b).

9. The method according to claim 8, wherein a word line bias of each programmed bit has a voltage 9.5V for the targeted programmed state 01, a voltage 8.5V for the targeted programmed state 00 and a voltage 7.5V for the targeted programmed state 10 in the step (a).

10. The method according to claim 4, wherein a bit line bias of each programmed bit is increased from 4.0V to 4.5V for the targeted programmed state 01, increased from 3.5V to 4.0V for the targeted programmed state 00 and increased from 3.0V to 3.5V for the targeted programmed state 10 in the step (a).

11. The method according to claim 8, wherein the word line bias of each programmed bit has a constant voltage equal to the first PV level and a bit line bias of each programmed bit has a constant voltage smaller than a maximum of the voltage range in the step (a) corresponding to the targeted programmed state in the step (b).

12. The method according to claim 11, wherein the bit line bias of each programmed bit has the constant voltage 4V~4.5V for the targeted programmed state 01, 3.5V~4.0V for the targeted programmed state 00 and 3.0V~3.5V for the targeted programmed state 10 in the step (b).

13. The method according to claim 1, wherein a program shot number of the step (a) is 1~3.

14. The method according to claim 1, wherein the step (a) comprises determining if every bit of the memory has a Vt level higher than the first PV level of the targeted programmed state and if yes, stopping the method.

15. The method according to claim 1, wherein the step (b) comprises recording the bits of the memory with a Vt level higher than the first PV level of the targeted programmed state.

* * * * *